United States Patent [19]

Mistretta et al.

[11] Patent Number: 5,285,158
[45] Date of Patent: Feb. 8, 1994

[54] NMR ANGIOGRAPHY USING FAST PULSE SEQUENCES WITH PREPARATORY PULSES

[75] Inventors: Charles A. Mistretta; Frank R. Korosec, both of Madison; David M. Weber, Middleton; Thomas M. Grist, Madison, all of Wis.

[73] Assignee: Wisconsin Alumni Research Foundation, Madison, Wis.

[21] Appl. No.: 926,658

[22] Filed: Aug. 6, 1992

[51] Int. Cl.$^5$ .................................. G01R 33/70
[52] U.S. Cl. .................... 324/309; 324/306; 128/653.3
[58] Field of Search ............ 324/306, 309, 307, 300; 128/653.3, 653.2

[56] References Cited

U.S. PATENT DOCUMENTS

| 4,718,424 | 1/1988 | Nishimura | 324/306 |
| 4,800,889 | 1/1989 | Dumoulin | 324/309 |
| 4,870,361 | 9/1989 | In Den Kleef et al. | 324/307 |
| 5,031,624 | 7/1991 | Mistretta et al. | 324/306 |
| 5,101,156 | 3/1992 | Pelc | 324/306 |
| 5,115,812 | 5/1992 | Sano et al. | 324/306 |

OTHER PUBLICATIONS

*Magnetic Resonance Angiography*, Nishimura, et al., IEEE TMI, MI-5, 140-151, 1986.
*Real-time Flow Measurements Using Echo-Planar Imaging*, Guilfoyle, et al., Magn. Reson. Med., 18, 1-18, 1991.
*Cancellation Excitation for Angiography*, Pauly, et al., Fifth SMRM, 70-71, 1986.
*Robust Velocity Selective Excitation*, Pauly et al., 6th SMRM, 27, 1987.
*Quantitative Single-shot flow Velocity Imaging with Stationary Signal Suppression using Flow-selective Pulses*, Pope et al., 10th SMRM, 96, 1992.
*Encoding Velocity Information In NMR Images By Phase Tagging*, Lee, et al., 10th SMRM, 812, 1991.
*Direct Acquisition Phase Contrast Angiography*, J. N. Lee, 10th SMRM, 818, 1991.
*Flow Imaging By Stationary Spin Suppression*, H. Lee, 10th SMRM, 1154, 1991.
*Driven Equilibrium MR Angiography: A Study of Static Spin Suppression*, Foster et al., 6th SMRM, 30, 1987.
*GRASE Imaging: A Novel Fast MRI Technique*, Oshio, et al., Magn. Reson. Med. 20(2):344-349, 1991.

Primary Examiner—Michael J. Tokar
Assistant Examiner—Raymond Y. Mah
Attorney, Agent, or Firm—Quarles & Brady

[57] ABSTRACT

An angiogram is produced using NMR fast pulse sequences in which the views are acquired in shots preceded by a preparatory pulse sequence. Each shot is acquired twice with differing preparatory pulse sequences and the resulting NMR data is subtracted to null the stationary tissues in the reconstructed image.

8 Claims, 4 Drawing Sheets

NMR ANGIOGRAPHY USING FAST PULSE SEQUENCES WITH PREPARATORY PULSES

This invention was made with United States Government support awarded by the National Institute of Health (NIH), Grant No. NRSA, CA9206-13. The United States Government has certain rights in this invention.

BACKGROUND OF THE INVENTION

The field of the invention is nuclear magnetic resonance imaging methods and systems. More particularly, the invention relates to the production of angiograms using data acquired with fast NMR pulse sequences.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency. The degree to which the net magnetic moment $M_z$ is tipped, and hence the magnitude of the net transverse magnetic moment $M_t$ depends primarily on the length of time and the magnitude of the applied excitation filed $B_1$.

The practical value of this phenomenon resides in the signal which is emitted by the excited spins after the excitation signal $B_1$ is terminated. In simple systems the excited spin induce an oscillating sine wave signal in a receiving coil. The frequency of this signal is the Larmor frequency, and its initial amplitude, $A_0$, is determined by the magnitude of the transverse magnetic moment $M_t$.

The NMR measurements of particular relevance to the present invention are called "pulsed NMR measurements." Such NMR measurements are divided into a period of RF excitation and a period of signal emission. Such measurements are performed in a cyclic manner in which the NMR measurement is repeated many times to accumulate different data during each cycle or to make the same measurement at different locations in the subject. A wide variety of preparative excitation techniques are known which involve the application of one or more RF excitation pulses ($B_1$) of varying magnitude, duration, and direction. Such excitation pulses may have a narrow frequency spectrum (selective excitation pulse), or they may have a broad frequency spectrum (nonselective excitation pulse) which produces transverse magnetization $M_t$ over a range of resonant frequencies. The prior art is replete with excitation techniques that are designed to take advantage of particular NMR phenomena and which overcome particular problems in the NMR measurement process.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

NMR data for constructing images can be collected using one of many available techniques. Typically, such techniques comprise a pulse sequence made up of a plurality of sequentially implemented views. Each view may include one or more NMR experiments, each of which comprises at least an RF excitation pulse and a magnetic field gradient pulse to encode spatial information into the resulting NMR signal.

The concept of acquiring NMR image data in a short time period has been known since 1977 when the echo-planar pulse sequence was proposed by Peter Mansfield (J. Phys. C.10: L55–L58, 1977). In contrast to standard pulse sequences, the echo-planar pulse sequence produces a set of NMR signals for each RF excitation pulse. These NMR signals can be separately phase encoded so that an entire scan of 64 views can be acquired in a single pulse sequence of 20 to 100 milliseconds in duration. Other echo-planar pulse sequences are disclosed in U.S. Pat. Nos. 4,678,996; 4,733,188; 4,716,369; 4,355,282; 4,588,948 and 4,752,735.

Another pulse sequence used to acquire NMR image data quickly is known generally as a fast spin echo (FSE) pulse sequence. One such FSE pulse sequence known as a "Rapid Acquisition Relaxation Enhanced" (RARE) sequence is described by J. Hennig et al in an article in *Magnetic Resonance in Medicine* 3,823–833 (1986) entitled "RARE Imaging: A Fast Imaging Method For Clinical MR." A difference between the RARE sequence and the EPI sequence lies in the manner in which echo signals are produced. The RARE sequence utilizes RF refocused echoes generated from a Carr-Purcell-Meiboom-Gill (CPMG) sequence, while EPI methods employ gradient recalled echoes.

Yet another pulse sequence used to acquire NMR image data quickly is known in the art generally as fast gradient-echo pulse sequences and is known by various acronyms such as FLASH, GRASS, Turbo-FLASH, Turbo-GRASS, SPGR, Turbo-SPGR and Ultrafast-SPGR. Such a fast gradient-echo sequence is described by Haase et al "FLASH Imaging: Rapid NMR Imaging Using Low Flip Angle Pulses," *J. Magn. Res.* 67:258–266; 1986, and is distinguished from the EPI sequence in that transverse magnetization is spoiled after acquisition of each phase encoding view and a new RF excitation pulse is applied before acquisition of the next view.

Regardless of the fast pulse sequence used, a scan is typically performed as a number of "shots" in which a set of NMR signals (e.g. 16) are acquired. For example, if 128 separate phase encoding views are acquired during a complete scan, one complete image data set can be acquired in eight shots (i.e. 128/16).

There are a number of well known NMR techniques for measuring the motion, or flow of spins within the region of interest. These include the "time-of-flight" method in which a bolus of spins is excited as it flows past a specific upstream location and the state of the resulting transverse magnetization is examined at a downstream location to determine the velocity of the bolus. This method has been used for many years to measure flow in pipes, and in more recent years it has been used to measure blood flow in human limbs. Examples of this method are disclosed in U.S. Pat. Nos. 3,559,044; 3,191,119; 3,419,793 and 4,777,957.

A second flow measurement technique is the inflow/outflow method in which the spins in a single, localized volume or slice are excited and the change in the resulting transverse magnetization is examined a short time later to measure the effects of excited spins that have flowed out of the volume or slice, and the effects of differently excited spins that have flowed into the volume or slice. Examples of this method are described in U.S. Pat. Nos. 4,574,239; 4,532,474 and 4,516,582.

A third technique for measuring motion flow relies upon the fact that an NMR signal produced by spins flowing through a magnetic field gradient experiences a phase shift which is proportional to velocity. This is referred to in the art as the "phase modulation" technique. For flow that has a roughly constant velocity during the measurement cycle the change in phase of the NMR signal is given as follows:

$$\Delta\phi = \gamma M_1 v$$

where $M_1$ is the first moment of the magnetic field gradient, $\gamma$ is the gyromagnetic ratio and $v$ is the velocity of the spins. By performing two complete scans with different magnetic field gradient first moments, an angiogram may be produced. Although there are a number of different procedures for producing such angiograms, in essence the signals from the two scans are subtracted such that stationary spins appear dark and moving spins appear light in the reconstructed image.

A number of techniques have been proposed for producing angiograms using fast NMR pulse sequences. For example, in a sequence described by D. N. Guilfoyle et al "Real Time Flow Measurements Using Echo Planar Imaging," *Magnetic Resonance in Medicine* 18, 1–8 (1991) an EPI pulse sequence is preceded by a preparatory sequence which destroys a component of the magnetization from flowing spins ($M_y \sin\theta$) or else a component of the magnetization from flowing spins along with the magnetization from static spins ($M_y \sin\theta + M_{static}$) by applying a series of three RF pulses, a motion encoding gradient and a spoiler gradient. While this preparatory sequence suppresses magnetization associated with stationary spins, when applied to fast spin-echo or fast gradient-echo sequences stimulated echoes are induced by this preparatory sequence, and artifacts are produced in the image. In addition, the signals produced by stationary spins are not suppressed sufficiently by this sequence to provide good angiograms.

SUMMARY OF THE INVENTION

The present invention relates to a method for producing angiograms using fast NMR pulse sequences in which the fast NMR pulse sequences are grouped into shots and each shot is preceded by a motion sensitizing preparatory sequence. More specifically, a first shot containing a set of fast NMR pulse sequences is preceded by a preparatory sequence comprised of a 90° RF pulse that tips longitudinal magnetization into the transverse plane, a 180° RF pulse, a bipolar motion encoding gradient having a first moment which separates the transverse magnetization produced by moving spins from the transverse magnetization produced by stationary spins, and a second 90° RF pulse which tips a component of the transverse magnetization produced by moving spins to the longitudinal axis. The next shot contains the same set of fast NMR pulse sequences and is preceded by the same preparatory sequence except the bipolar motion encoding gradient has a different first moment. The NMR data acquired from the two shots is subtracted to produce angiogram image data in which signals from stationary spins are substantially suppressed.

A general object of the invention is to reduce the echo time (TE) in a fast gradient-echo pulse sequence used to produce an angiogram. This is achieved by employing motion encoding gradients in a preparatory sequence which precedes a shot of fast gradient-echo pulse sequences, rather than including the motion encoding gradients in each pulse sequence.

Another object of the invention is to enhance the suppression of stationary tissue in angiograms produced with fast NMR pulse sequences. During the acquisition of each shot the longitudinal magnetization from stationary spins has an opportunity to recover and to produce signal components in the NMR data acquired later in the shot. These signals are cancelled by repeating the shot with a different motion encoding gradient (or none) and subtracting the corresponding NMR data.

A more specific object of the invention is to reduce artifacts caused by stimulated echoes induced by the preparatory pulse sequence. This is achieved by producing the bipolar motion encoding gradient after the 180° RF pulse in the preparatory pulse sequence.

Yet another object of the invention is to reduce artifacts caused by movement of the patient. Each shot may be cardiac gated and the pair of shots to be subtracted may be acquired during the same phase of successive cardiac cycles. Stationary tissues are thus similarly positioned during each shot and are more accurately nulled by the subtraction process.

Another object of the invention is to reduce ghosting artifacts by acquiring NMR data that is "captured" at one point in the cardiac cycle.

Yet another object of the invention is to provide improved separation of arterial and venous signals by using a flow encoding gradient with a small first moment and acquiring the NMR data during peak systole.

A more specific object of the invention is to facilitate visualization of highly pulsatile vessels by acquiring NMR signals which remain large throughout the cardiac cycle.

Another object of the invention is to provide angiogram image data using fast NMR pulse sequences that enable the entire acquisition to take place within a single breath hold. Fast pulse sequences which can be used successfully on standard, commercially available NMR imaging systems may be used, and the total scan time is reduced by employing motion encoding gradients prior to a set of such pulse sequences rather than in each fast NMR pulse sequence. For example, one preparatory sequence for a shot of sixteen fast NMR pulse sequences is preferred.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
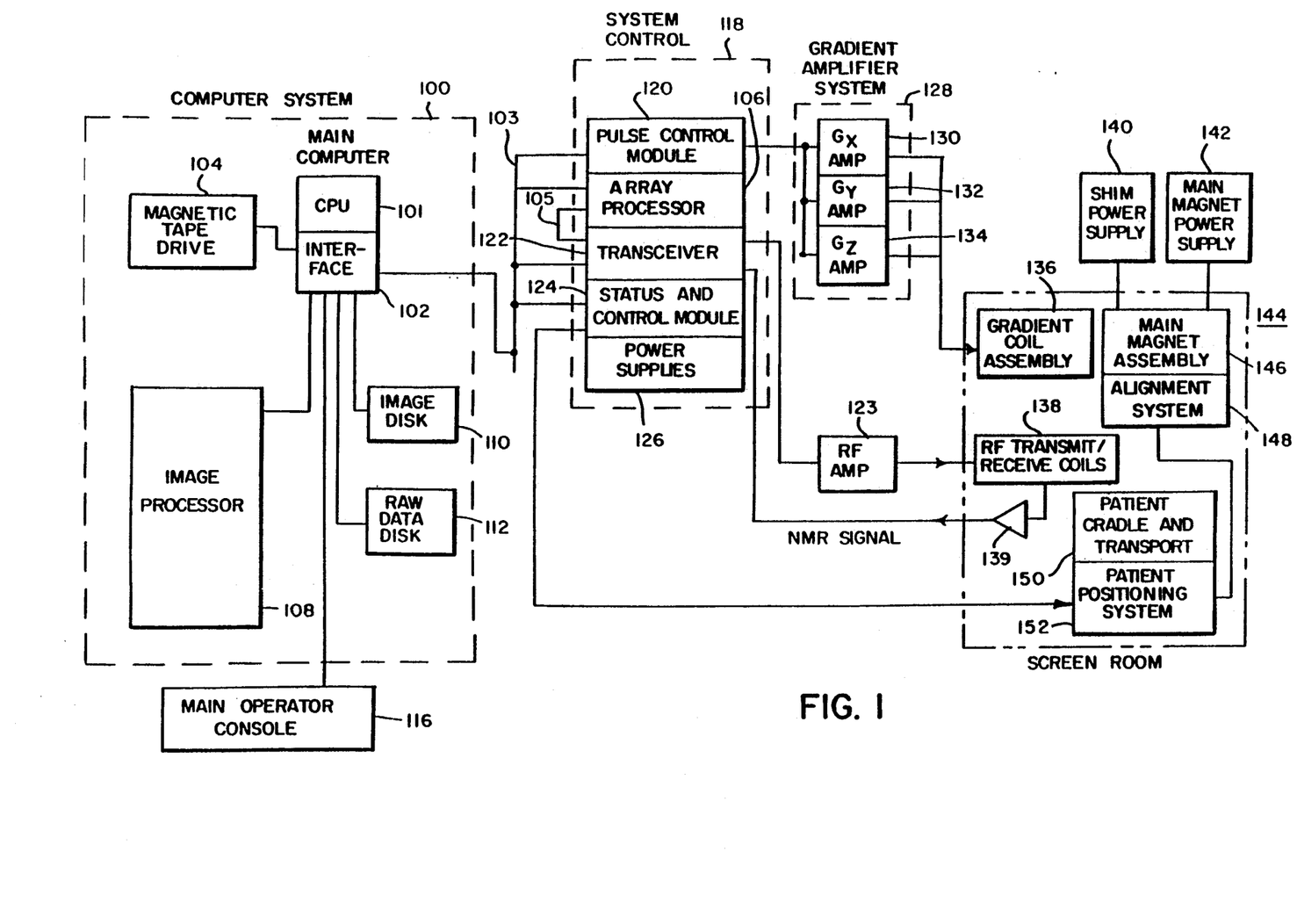
FIG. 1 is a block diagram of an NMR system which employs the present invention.

Referring first to FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (such as a Data General MV7800). The computer has associated therewith an interface 102 through which a plurality of computer peripheral devices and other NMR system components are coupled. Among the computer peripheral devices is a magnetic tape drive 104 which may be utilized under the direction of the main computer for archiving patient data and images to tape. Processed patient data may also be stored in an image disc storage device designated 110. The function of image processor 108 is to provide interactive image display manipulation such as magnification, image comparison, gray-scale adjustment and real-time data display. The computer system is provided with a means to store raw data (i.e. before image construction) utilizing a disc data storage system designated 112. An operator console 116 is also coupled to the computer by means of interface 102 and provides the operator with the means to input data pertinent to a patient study as well as additional data necessary for proper NMR system operation, such as calibrating, initiating and terminating scans. The operator console is also used to display images stored on discs or magnetic tape.

The computer system 100 exercises control over the NMR system by means of system control 118 and gradient amplifier system 128. The computer 100 communicates with system control 118 by means of a link 103 in a manner well known to those skilled in the art. The system control 118 includes several subsystems such as a pulse control module (PCM) 120, an array processor 106, a radio frequency transceiver 122, a status and control module (SCM) 124, and the power supplies generally designated 126 necessary to energize the components. The PCM 120 utilizes control signals provided by main computer 101 to generate digital timing and control signals such as the digital waveforms which control gradient coil excitation, as well as RF envelope waveforms utilized in the transceiver 122 for modulating the RF excitation pulses. The gradient waveforms are applied to the gradient amplifier system 128 generally comprised of $G_x$, $G_y$ and $G_z$ amplifiers 130, 132 and 134, respectively. Each amplifier 130, 132 and 134 is utilized to excite a corresponding gradient coil in an assembly generally designated 36 and which is part of a magnet assembly 146. When energized, the gradient coils generate magnetic field gradients $G_x$, $G_y$ and $G_z$ of the magnetic field in the same direction as the main polarizing magnetic field, wherein the gradients are directed in mutually orthogonal X-, Y- and Z-axis directions of a Cartesian coordinate system. That is, if the magnetic field generated by the main magnet (not shown) is directed in the z direction and is termed $B_0$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x, y, z) is given by $B(x, y, z) = B_0 + G_x X + G_y Y + G_z Z$.

The gradient magnetic fields are utilized in combination with radio frequency pulses generated by transceiver 122, RF amp 128 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency waveform modulated in accordance with the control signals to an RF power amplifier 123 which then energizes RF coil 138 which is situated within main magnet assembly 146. The NMR signals radiated by the excited nuclei in the patient are sensed by the same or a different RF coil than is used for transmitting and amplified by a preamplifier 139. The NMR signals are amplified, demodulated, filtered, and digitized in the receiver section of the transceiver 122. The processed NMR signals are transmitted to the array processor 106 for processing by means of a dedicated, unidirectional link 105.

The PCM 120 and SCM 124 are independent subsystems both of which communicate with main computer 101, peripheral system, such as patient positioning system 152, as well as to one another by means of serial communications link 103. The PCM 120 and SCM 124 are each comprised of a 16-bit microprocessor (such as Intel 80286) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148. A shim power supply 140 is utilized to energize shim coil associated with the main magnet and which are used to correct inhomogeneities in the polarizing magnet field. In the case of a resistive magnet, main magnet power supply 142 is utilized to continuously energize the magnet. In the case of a superconductive magnet, the main power supply 142 is utilized to bring the polarizing field produced by the magnet to the proper operating strength and is then disconnected. In the case of a permanent magnet, power supply 142 would not be needed. The patient alignment system 148 operates in combination with a patient cradle and transport system 150 and patient positioning system 152. To minimize interference from external sources, the NMR system components comprised of the main magnet assembly, the gradient coil assembly, and the RF transmit and receiver coils, as well as the patient-handling devices, are enclosed in an RF-shielded room generally designated 144.

Figure 2:
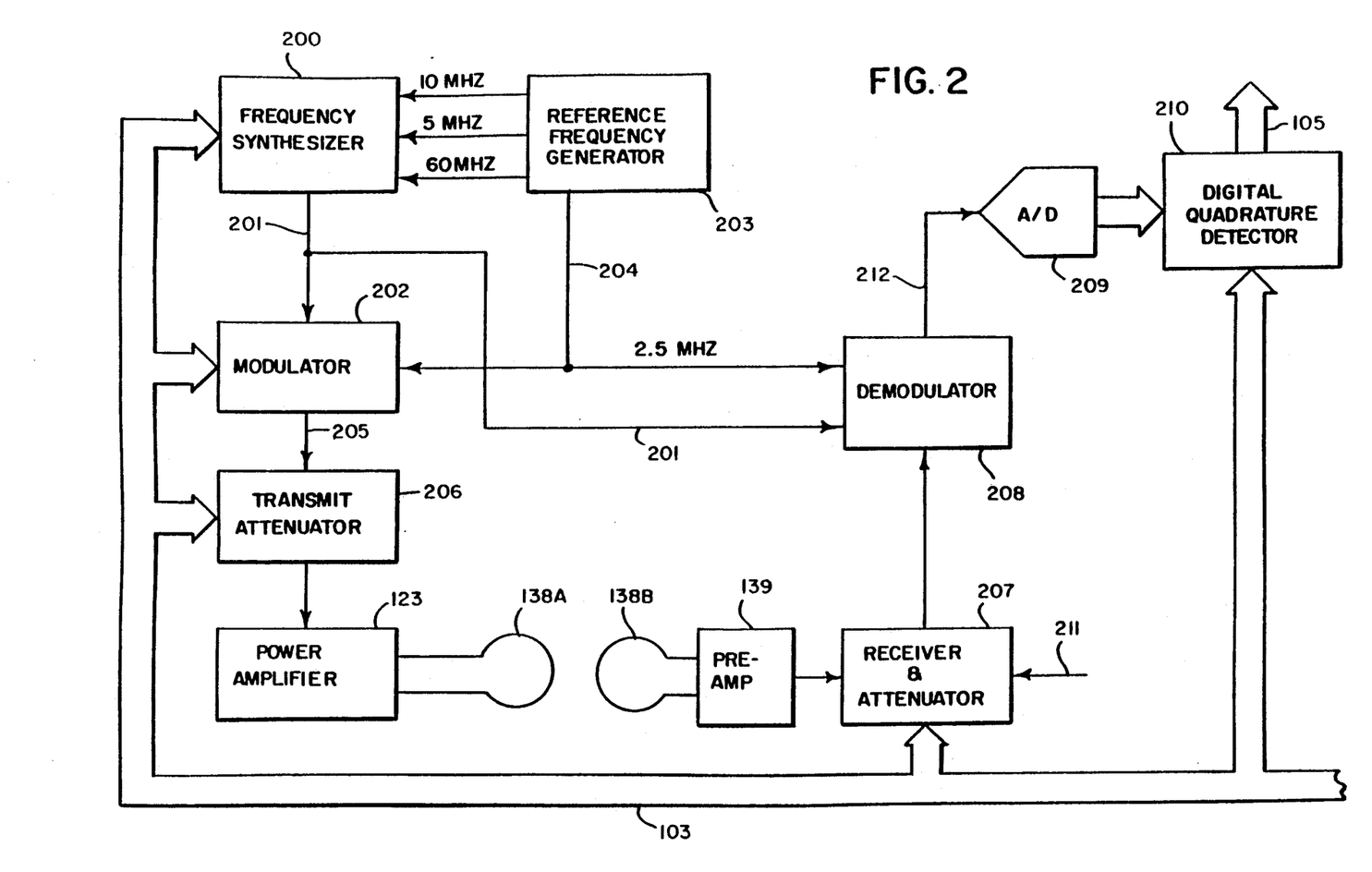
FIG. 2 is an electrical block diagram of the transceiver which forms part of the NMR system of FIG. 1.

Referring particularly to FIGS. 1 and 2, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced under control of a frequency synthesizer 200 which receives a set of digital signals (CF) through the communications link 103 from the main computer 101. These digital signals indicate the frequency and phase of the RF carrier signal which is produced at an output 201. The commanded RF carrier is applied to a modulator 202 where it is modulated in response to a signal R(t) received through bus 103 from the PCM 120. The signal R(t) defines the envelope, and therefore the bandwidth, of the RF excitation pulse to be produced. It is produced in the PCM 120 by sequentially reading a series of stored 16-bit digital values out of pulse shape look-up table that represent the desired envelope. These stored digital values are "played out" by a 1 MHz clock signal as the RF excitation pulse is produced, and these values may be changed by the computer 100 to enable any desired RF pulse envelope to be produced.

The magnitude of the RF excitation pulse output through line 205 is attenuated by a transmit attenuator circuit 206 which receives a digital signal, TA, from the main computer 101 through communications link 103. The attenuated RF excitation pulses are applied to the power amplifier 123 that drives the RF transmitter coil 138A. For a more detailed description of this portion of the transceiver 122, reference is made to U.S. Pat. No. 4,952,877 which issued on Aug. 28, 1990 and which is incorporated herein by reference.

Referring still to FIGS. 1 and 2 the NMR signal produced by the subject is picked u by the receiver coil 138B and applied to the input of a receiver 207. The receiver 207 amplifies the NMR signal and this is attenuated by an amount determined by a digital attenuation signal (RA) received from the main computer 101 through link 103. The receiver 207 is also turned on and off by a signal through line 211 from the PCM 120 such that the NMR signal is acquired only over the time intervals required by the particular acquisition being performed.

The received NMR signal is at or around the Larmor frequency, which in the preferred embodiment is around 63.86 MHz. This high frequency signal is demodulated in a two step process in a demodulator 208 which first mixes the NMR signal with the carrier signal on line 201 and then mixes the resulting difference signal with the 2.5 MHz reference signal on line 204. The resulting demodulated NMR signal on line 212 has a bandwidth of 125 kHz and it is centered at a frequency of 187.5 kHz. The demodulated NMR signal is applied to the input of an analog-to-digital (A/D) converter 209 which samples and digitizes the analog signal at a rate of 250 kHz. The output of the A/D converter 209 is applied to a digital quadrature detector 210 which produces 16-bit in-phase (I) values and 16-bit quadrature (Q) values corresponding to the received digital signal. The resulting stream of digitized I and Q values of the received NMR signal is output through bus 105 to the array processor 106 where they are typically employed to reconstruct an image.

To preserve the phase information contained in the received NMR signal, both the modulator 202 in the transmitter section and the demodulator 208 in the receiver section are operated with common signals. More particularly, the carrier signal at the output 201 of the frequency synthesizer 200 and the 2.5 MHz reference signal at the output 204 of the reference frequency generator 203 are employed in both the modulation and the demodulation process. Phase consistency is thus maintained and phase changes in the demodulated received NMR signal accurately indicate phase changes produced by the excited spins. The 2.5 MHz reference signal as well as 5, 10 and 60 MHz reference signals are produced by the reference frequency generator 203 from a common 10 MHz clock signal, and the latter three reference signals are employed by the frequency synthesizer 200 to produce the carrier signal on output 201. For a more detailed description of the receiver, reference is made to U.S. Pat. No. 4,992,736 which is incorporated herein by reference.

Figure 3A:
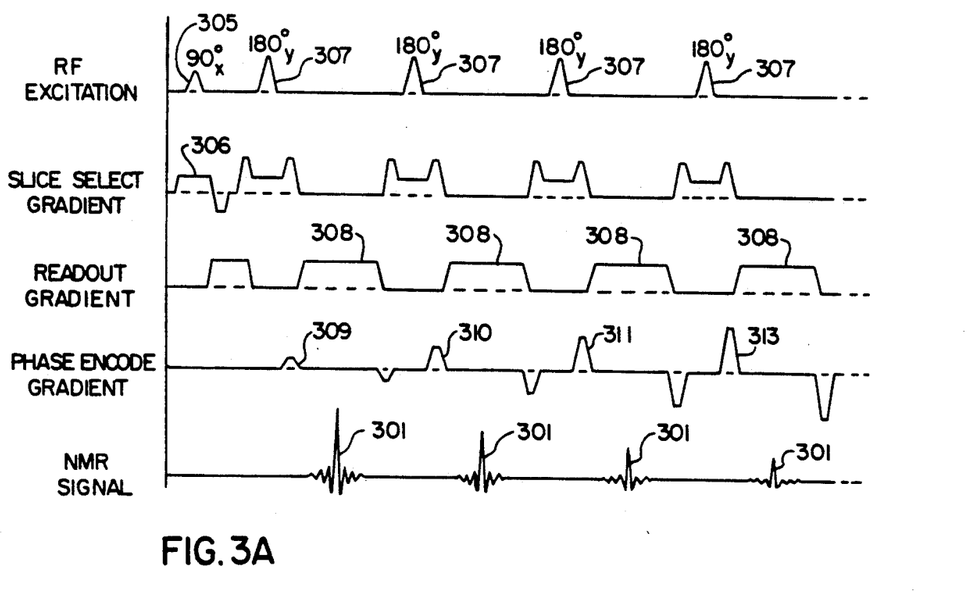
FIG. 3A is a graphic representation of a fast spin echo pulse sequence which may be employed by the NMR system of FIG. 1 to practice the present invention.

Referring particularly to FIG. 3A, a conventional fast spin echo NMR pulse sequence, referred to in the art as a 2DFT RARE sequence, is shown in which sixteen NMR echo signals are acquired. For clarity, only four echo signals 301 are shown in FIG. 3A, but it can be appreciated that twelve more are produced and acquired. These NMR echo signals are produced by a 90° RF excitation pulse 305 which is generated in the presence of a $G_z$ slice select gradient pulse 306 to tip longitudinal magnetization into the transverse plane. This transverse magnetization is refocused by each of sixteen selective 180° RF refocusing pulses 307 to produce the NMR spin echo signals 301 that are acquired in the presence of $G_x$ readout gradient pulses 308. In the preferred embodiment the 180° RF refocusing pulses 307 occur every 6.4 milliseconds, and the center of the first one occurs 3.2 milliseconds after the center of the 90° RF excitation pulse 305. Each NMR spin echo signal 301 is separately phase encoded by respective $G_y$ phase encoding pulses 309–313. The magnitude of each phase encoding pulse is different, and it is stepped through 128 values to acquire 128 separate views during a complete scan. Each NMR spin echo signal is acquired by digitizing 256 samples of each signal. As a result, at the completion of a scan for one image, 8 shots (128/16=8) of the pulse sequence of FIG. 3A have been executed and a 128 by 256 element array of complex numbers have been acquired. A conventional image may be reconstructed by performing a 2D Fourier transformation on this image data array and then calculating the absolute value of each resulting complex element. A 128 by 256 pixel image is thus produced in which the brightness of each pixel is determined by the magnitude of its corresponding element in the transformed array.

Figure 3B:
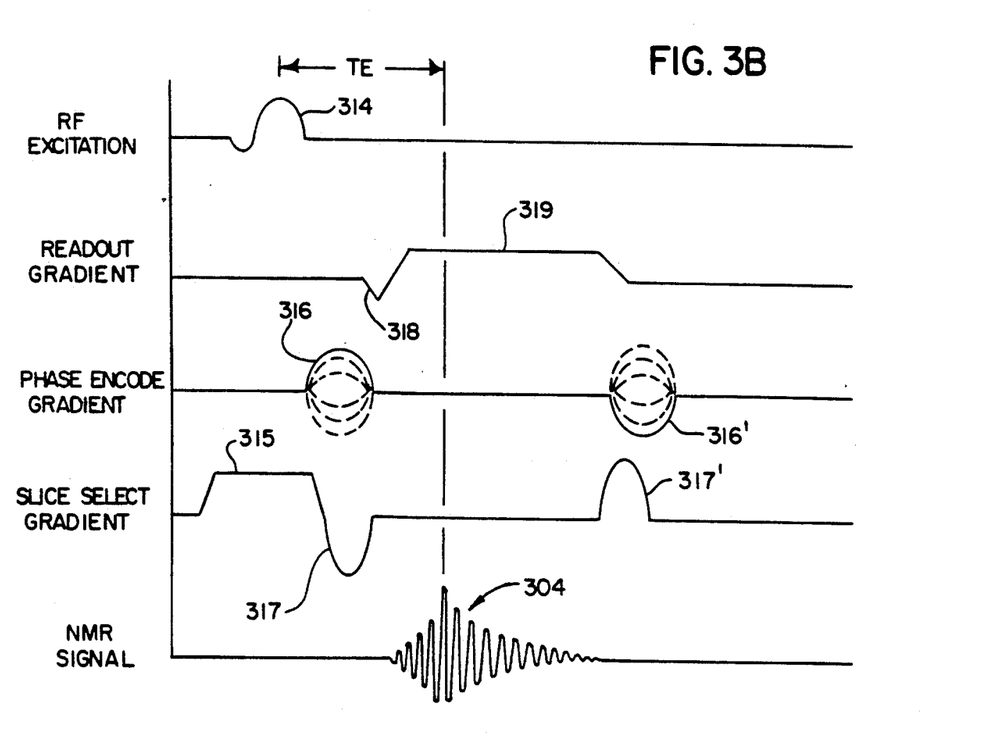
FIG. 3B is a graphic representation of a fast gradient recalled echo pulse sequence which may be employed by the NMR system of FIG. 1 to practice the present invention.

Referring particularly to FIG. 3B, another fast NMR pulse sequence which may be used with the present invention is a gradient recalled echo fast pulse sequence. It includes an RF excitation pulse 314 which is produced in the presence of a $G_z$ slice select gradient pulse 315. The resulting transverse magnetization is then position encoded by the application of a $G_y$ phase encoding gradient pulse 316. A negative lobe 317 on the slice select gradient rephases stationary spins in the selected slice in the well known manner. A $G_x$ readout magnetic field gradient is then applied and includes a negative dephasing lobe 318 followed by a positive frequency encoding lobe 319. The readout gradient produces an NMR echo signal 304 at a time TE and it is acquired asymmetrically during the application of the frequency encoding readout gradient 319. After the signal acquisition, a phase encoding rewinder pulse 316' is applied which is the same magnitude but opposite in polarity to the phase encoding pulse 316, and a crusher gradient pulse 317' is applied to eliminate any transverse magnetization that may remain after each acquisition.

A very short TE of 2.8 msecs is achieved with the pulse sequence of FIG. 3B by shortening the gradient pulses as much as possible and by asymmetrically acquiring the NMR echo signal 304 with its peak shifted to the leading edge of the acquisition window. Best results are obtained by using a tip angle of 15° to 25° on the RF pulse 314 and including sixteen of the pulse sequences in each shot.

Figure 4:
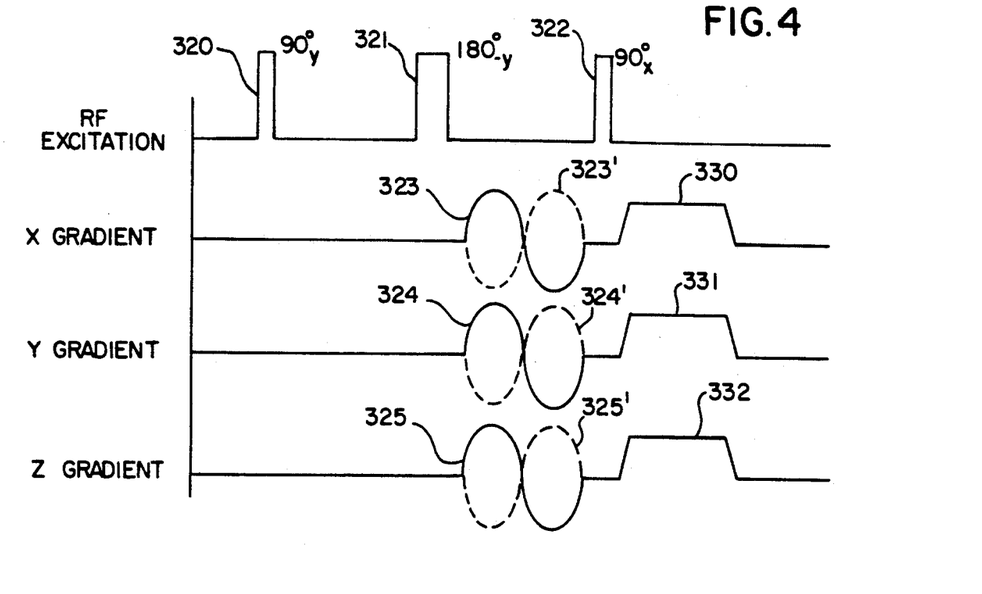
FIG. 4 is a graphic representation of the preferred embodiment of the preparatory pulse sequence of the present invention.

To produce an angiogram according to the present invention using a fast pulse sequence of FIG. 3A or 3B, each shot of sixteen imaging pulse sequences is preceded by a preparatory pulse sequence which suppresses the longitudinal magnetization of stationary spins. Referring particularly to FIG. 4, this preparatory pulse sequence includes a set of three RF excitation pulses 320, 321 and 322. The first RF pulse 320 and last RF pulse 322 are 90° pulses with the phase of the first RF pulse 320 being aligned along the y axis and the phase of the last RF pulse 322 being aligned along the x axis. The RF pulses 320 and 322 are spaced from 8.5 to 9.0 msecs apart. The 180° RF pulse 321 is positioned midway between RF pulses 320 and 322 and its phase is aligned with the -y axis.

A bipolar motion encoding magnetic field gradient is produced during the interval between the 180° RF pulse 321 and the 90° RF pulse 322. The magnitude and direction of this bipolar magnetic field gradient can vary considerably, but in the preferred embodiment equal bipolar gradient lobes 323-325 having a positive first moment are applied along the respective x, y and z axes. As is well known in the art, the value of the first moment $M_1$ of the bipolar magnetic field gradients 323-325 is determined by area of its lobes and the time interval between them. The polarity of the first moment $M_1$ is determined by the polarity order of the bipolar lobes, where a positive first moment $+M_1$ is produced by a positive lobe followed by a negative lobe and a negative first moment $-M_1$ is produced by a negative lobe followed by a positive lobe, as indicated by dotted lines 323'-325'.

The preparatory pulse sequence concludes with the application of dephasing gradient pulses 330-332 applied along the respective x, y and z axes. These pulses 330-332 have a duration of approximately 4 msecs and an amplitude sufficient to dephase any transverse magnetization that may be present in the region of interest following the third RF pulse 322.

The preparatory pulse sequence serves to align a component of the magnetization associated with moving spins along the positive or negative longitudinal axis (±z axis in the preferred embodiment) and to align the magnetization associated with stationary spins in the transverse plane (x-y in the preferred embodiment). The first 90° RF pulse 320 tips all longitudinal magnetization into the transverse plane and the 180° RF pulse 321 inverts this transverse magnetization. The bipolar motion encoding gradients 323-325 then change the phase of magnetization associated with spins having a velocity along the respective x, y or z axes and the final 90° RF pulse 322 tips a component of the magnetization associated with moving spins back the longitudinal axis. The magnetization associated with stationary spins remains in the transverse plane where it is dephased by the gradient pulses 330-332. The magnitude and polarity of the magnetization remaining along the longitudinal axis after the preparatory pulse sequence is determined by the direction and velocity of the moving spins in the region of interest and by the magnitude and polarity of the first moment $M_1$ produced by the bipolar motion encoding gradients 323-325. For a given spin system, therefore, the polarity of the net longitudinal magnetization due to moving spins will reverse when the polarity of the first moment of the bipolar gradients is reversed, whereas any residual longitudinal magnetization due to stationary spins will not be reversed. Therefore, it is a teaching of the present invention that signals from stationary tissues can be further suppressed by executing each shot of sixteen phase encoding views twice, with preparatory pulse sequences preceding each shot that have bipolar motion encoding gradients 323-325 with different first moments. The corresponding NMR signals produced in each such pair are subtracted and used to reconstructed an angiogram image. In the preferred embodiment a complex subtraction of the raw "k-space" data is performed, however, it is also possible to produce image data and subtract the phases of corresponding points in the two image data arrays to preserve directional information.

In the preferred embodiment the polarity of the first moment $M_1$ is reversed to provide the required difference, but a satisfactory difference signal can also be produced by changing only the magnitude of the first moment. For example, one shot can be prepared with a first moment $M_1$ and the second shot can be prepared with a first moment equal to zero (i.e. no bipolar gradients are applied). In any case the signals produced by stationary spins remain unchanged in the two shots and they are nulled by the subtraction process.

Figure 5:
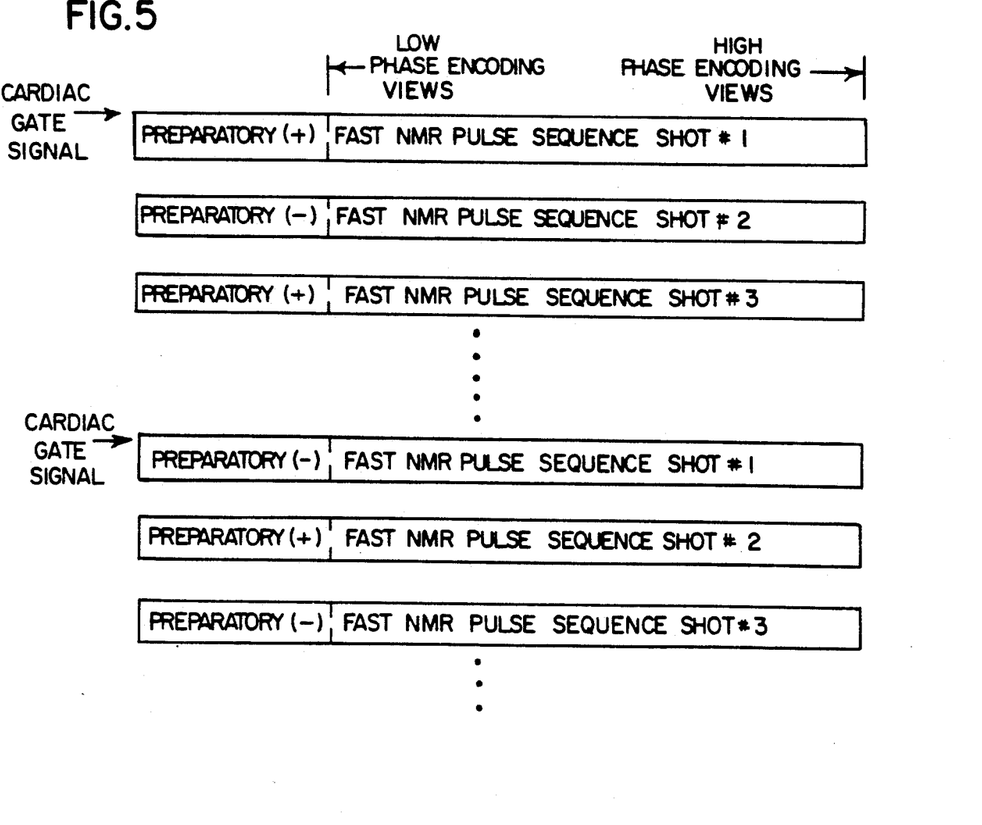
FIG. 5 is a graphic representation of a set of fast pulse sequences combined into a shot with a preparatory pulse sequence in accordance with the present invention.

While in many instances the order in which the pulse sequence shots are acquired is of little importance, when angiograms are produced of organs such as the heart further improvements can be made to image quality by ordering the shots and by ordering the views within each shot. Referring particularly to FIG. 5, for example, the shots in each pair may be obtained at the same point in successive cardiac cycles such that non-flowing, but nevertheless, moving tissues appear the same in both acquisitions. When a cardiac gate signal is produced to indicate the start of a cardiac cycle, shots may be acquired at any desired phase of the cardiac cycle with a "positive" preparatory pulse sequence to capture the data when the non-flowing tissues are in the desired position. The other shot in the pair with a "negative" preparatory pulse sequence is then acquired at the same point in the subsequent cardiac cycle so that non-flowing tissues appear the same in both acquisitions. As a result, when the data in each shot pair is subtracted, any magnetization due to non-flowing tissues will be substantially the same in both shots and will be nulled. As shown in FIG. 5, when more than one shot with preparatory pulse sequence is executed during each cardiac cycle, it is preferable to alternate the polarity of the motion encoding gradient first moment during successive shots. If maximum signal is the objective, then only one shot is acquired each cardiac cycle and the preparatory pulse sequence is executed at peak systole.

The brightness of the flowing spins in the reconstructed image can be improved by reordering the phase encoding views in each shot. More specifically, since the central, or low order, phase encoding views have significantly more impact on the image, those views can be acquired first in each shot whereas the higher order views are acquired later in each shot when the signals are reduced due to $T_2$ decay in the fast spin echo signal sequence or saturation in the fast gradient recalled echo pulse sequence. This phase encoding order also ensures that the signal from stationary tissues will be the smallest during acquisition of the lowest order phase encoding values.

We claim:

1. A method for producing an angiogram using fast NMR pulse sequences, the steps comprising:
   a) applying a polarizing magnetic field to spins located in a region of interest;
   b) performing a first data acquisition comprised of a preparatory pulse sequence followed by a set of fast NMR pulse sequences, each fast NMR pulse sequence including:
   applying an RF pulse to the spins in the region of interest,
   applying a phase encoding gradient pulse to the spins in the region of interest to define a view which is different for each fast NMR pulse sequence in said set; and
   acquiring an NMR signal;
   and said preparatory pulse sequence including:
   applying a first 90° RF pulse to the spins in the region of interest;
   applying a 180° RF pulse to the spins in the region of interest;
   applying a second 90° RF pulse to the spins in the region of interest; and
   applying a bipolar motion encoding magnetic field gradient to the spins in the region of interest prior to the application of said second 90° RF pulse, said bipolar motion encoding magnetic field gradient having a selected first moment;
   applying a dephasing gradient pulse to the spins in the region of interest after the application of said second 90° RF pulse;
   c) performing a second data acquisition comprised of said preparatory pulse sequence followed by said set of fast NMR pulse sequences, wherein the bipolar motion encoding magnetic field gradient in the second data acquisition has a different first moment;
   d) subtracting the set of NMR signals in one of said data acquisitions from the corresponding NMR signal in the other of said data acquisitions to produce a set of difference data; and
   e) producing an angiogram from the difference data.

2. The method as recited in claim 1 in which said bipolar motion encoding magnetic field gradient is produced during a time interval between the 180° RF pulse and the second 90° RF pulse.

3. The method as recited in claim 1 in which the RF pulse applied during each fast NMR pulse sequence is a 180° RF refocusing pulse.

4. The method as recited in claim 1 in which each fast NMR pulse sequence produces a gradient recalled echo NMR signal and includes the application of a readout gradient pulse to the spins in the region of interest which has one polarity during the acquisition of said NMR signal and the opposite polarity just prior to the acquisition of said NMR signal.

5. The method as recited in claim 1 in which the first and second data acquisitions are divided into shots comprised of subsets of said set of fast NMR pulse sequences and the preparatory pulse sequence is repeated prior to each shot.

6. The method as recited in claim 5 in which the performance of each shot is triggered by a signal indicative of the cardiac cycle of a patient located in the region of interest.

7. The method as recited in claim 6 in which the shots are performed in said second data acquisition at the same point in the indicated cardiac cycle as the corresponding shots performed in said first data acquisition.

8. The method as recited in claim 1 in which the fast NMR pulse sequences in the first and second data acquisitions are ordered such that fast NMR pulse sequences with lower phase encoding gradient pulses are performed first.

* * * * *